(12) United States Patent
Matsuo et al.

(10) Patent No.: US 10,551,704 B2
(45) Date of Patent: Feb. 4, 2020

(54) ACTIVE MATRIX SUBSTRATE METHOD OF MANUFACTURING ACTIVE MATRIX SUBSTRATE, AND DISPLAY DEVICE

(71) Applicant: JOLED INC., Tokyo (JP)

(72) Inventors: Eri Matsuo, Tokyo (JP); Tomoatsu Kinoshita, Tokyo (JP); Motohiro Toyota, Tokyo (JP); Yasunobu Hiromasu, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/615,834

(22) Filed: Jun. 7, 2017

(65) Prior Publication Data

US 2017/0363926 A1 Dec. 21, 2017

(30) Foreign Application Priority Data

Jun. 15, 2016 (JP) .................................. 2016-118475

(51) Int. Cl.
*G02F 1/1362* (2006.01)
*H01L 23/00* (2006.01)
*H01L 27/12* (2006.01)

(52) U.S. Cl.
CPC ........ *G02F 1/136286* (2013.01); *H01L 24/24* (2013.01); *H01L 24/82* (2013.01);
(Continued)

(58) Field of Classification Search
CPC combination set(s) only.
See application file for complete search history.

(56) References Cited

U.S. PATENT DOCUMENTS

2007/0236640 A1* 10/2007 Kimura ............. G02F 1/134363
349/141
2011/0240998 A1 10/2011 Morosawa et al.
(Continued)

FOREIGN PATENT DOCUMENTS

JP 2001-15762 A 1/2001
JP 2011-228622 A 11/2011
(Continued)

OTHER PUBLICATIONS

Office Action in JP Application No. 2016-118475, dated May 7, 2019. 5pp.

*Primary Examiner* — Charles D Garber
*Assistant Examiner* — Steven M Christopher
(74) *Attorney, Agent, or Firm* — Hauptman Ham, LLP

(57) ABSTRACT

Provided is an active matrix substrate that includes a substrate, a thin film transistor, an electrode layer, and a second insulating film. The thin film transistor is provided on the substrate and includes an oxide semiconductor layer, a gate electrode, and source and drain electrodes. The oxide semiconductor layer includes a first region as a channel region. The electrode layer is level with the gate electrode, is provided in a different region from the thin film transistor, and includes a first end. The second insulating film is provided between the substrate and the electrode layer and includes a second end at a more retreated position than the first end of the electrode layer. The oxide semiconductor layer further includes a second region having lower resistance than the first region. The electrode layer is electrically coupled, at the first end, to the second region of the oxide semiconductor layer.

3 Claims, 7 Drawing Sheets

(52) U.S. Cl.
CPC ............ *H01L 24/83* (2013.01); *H01L 27/124* (2013.01); *H01L 27/1262* (2013.01)

(56) References Cited

U.S. PATENT DOCUMENTS

| | | | |
|---|---|---|---|
| 2012/0306104 A1* | 12/2012 | Choi | H01L 21/565 257/782 |
| 2013/0221358 A1* | 8/2013 | Morosawa | H01L 29/66742 257/59 |
| 2015/0069391 A1 | 3/2015 | Kanegae et al. | |
| 2015/0179681 A1* | 6/2015 | Sato | H01L 27/1255 257/43 |

FOREIGN PATENT DOCUMENTS

| | | |
|---|---|---|
| JP | 2015-122417 A | 7/2015 |
| WO | 2014/147964 A1 | 9/2014 |

\* cited by examiner

ACTIVE MATRIX SUBSTRATE METHOD OF MANUFACTURING ACTIVE MATRIX SUBSTRATE, AND DISPLAY DEVICE

CROSS REFERENCE TO RELATED APPLICATIONS

This application claims the benefit of Japanese Priority Patent Application JP 2016-118475 filed on Jun. 15, 2016, the entire contents of which are incorporated herein by reference.

BACKGROUND

The disclosure relates to an active matrix substrate including thin film transistors (TFTs) and a method of manufacturing the same, and a display device including the active matrix substrate.

For a backplane of an organic EL display device or other display devices, used is an active matrix substrate including thin film transistors. As the thin film transistors, proposals have been made for those using oxide semiconductors. For example, reference is made to Japanese Unexamined Patent Application Publication No. 2011-228622.

SUMMARY

In the active matrix substrate as mentioned above, the thin film transistors are electrically coupled to, for example, capacitors and wirings to form a pixel circuit. In such an active matrix substrate and a display device using the active matrix substrate, there has been a desire for a structure having advantages in higher definition and enhanced yield.

It is desirable to provide an active matrix substrate, a method of manufacturing an active matrix substrate, and a display device that make it possible to enhance definition and yield.

According to an embodiment of the disclosure, there is provided an active matrix substrate including a substrate, a thin film transistor, an electrode layer, and a second insulating film. The thin film transistor is provided on the substrate and includes an oxide semiconductor layer, a gate electrode, and source and drain electrodes. The oxide semiconductor layer includes a first region as a channel region. The gate electrode is disposed in confronted relation with the first region of the oxide semiconductor layer with a first insulating film in between. The source and drain electrodes are electrically coupled to the oxide semiconductor layer. The electrode layer is level with the gate electrode, is provided in a different region from the thin film transistor, and includes a first end. The second insulating film is provided between the substrate and the electrode layer and includes a second end at a more retreated position than the first end of the electrode layer. The oxide semiconductor layer further includes a second region having lower resistance than the first region. The electrode layer is electrically coupled, at the first end, to the second region of the oxide semiconductor layer.

According to an embodiment of the disclosure, there is provided a method of manufacturing an active matrix substrate. The method includes: forming a thin film transistor on a substrate; forming, in a different region from the thin film transistor, an electrode layer; and forming a second insulating film between the substrate and the electrode layer. The thin film transistor includes an oxide semiconductor layer, a gate electrode, and source and drain electrodes. The oxide semiconductor layer includes a first region as a channel region. The gate electrode is disposed in confronted relation with the first region of the oxide semiconductor layer with a first insulating film in between. The source and drain electrodes are electrically coupled to the oxide semiconductor layer. The electrode layer is level with the gate electrode and includes a first end. The second insulating film includes a second end at a more retreated position than the first end of the electrode layer. The oxide semiconductor layer further includes a second region having lower resistance than the first region. The electrode layer is electrically coupled, at the first end, to the second region of the oxide semiconductor layer.

According to an embodiment of the disclosure, there is provided a display device provided with an active matrix substrate. The active matrix substrate includes a substrate, a thin film transistor, an electrode layer, and a second insulating film. The thin film transistor is provided on the substrate and includes an oxide semiconductor layer, a gate electrode, and source and drain electrodes. The oxide semiconductor layer includes a first region as a channel region. The gate electrode is disposed in confronted relation with the first region of the oxide semiconductor layer with a first insulating film in between. The source and drain electrodes are electrically coupled to the oxide semiconductor layer. The electrode layer is level with the gate electrode, is provided in a different region from the thin film transistor, and includes a first end. The second insulating film is provided between the substrate and the electrode layer and includes a second end at a more retreated position than the first end of the electrode layer. The oxide semiconductor layer further includes a second region having lower resistance than the first region. The electrode layer is electrically coupled, at the first end, to the second region of the oxide semiconductor layer.

In the active matrix substrate, the method of manufacturing the active matrix substrate, and the display device according to the embodiments of the disclosure, the electrode layer is level with the gate electrode of the thin film transistor, and is provided in the different region from the thin film transistor. The thin film transistor includes the oxide semiconductor layer. Between the electrode layer and the substrate, provided is the second insulating film. The second insulating film includes the second end at the more retreated position than the first end of the electrode layer. The oxide semiconductor layer further includes the second region having the lower resistance than the first region, or the channel region. The electrode layer is electrically coupled, at the first end, to the second region of the oxide semiconductor layer. Accordingly, it is possible to make electrical coupling of the thin film transistor to the electrode layer, without interposition of other metal layers. This leads to a smaller contact size and a higher degree of freedom in design layout.

According to the active matrix substrate, the method of manufacturing the active matrix substrate, and the display device in the embodiments of the disclosure, the electrode layer is level with the gate electrode and is provided in the different region from the thin film transistor. The electrode layer is electrically coupled, at the first end, to the second region of the oxide semiconductor layer of the thin film transistor. This makes it possible to make the electrical coupling of the oxide semiconductor layer of the thin film transistor to the electrode layer, without the interposition of other metal layers, leading to the higher degree of freedom in the design layout. Hence, it is possible to enhance definition and yield.

It is to be noted that effects of the disclosure are not limited to those described above, but may be other different effects, or may further include other effects.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, some embodiments of the disclosure are described in detail with reference to the accompanying drawings. It is to be noted that description is made in the following order.

Figure 1:
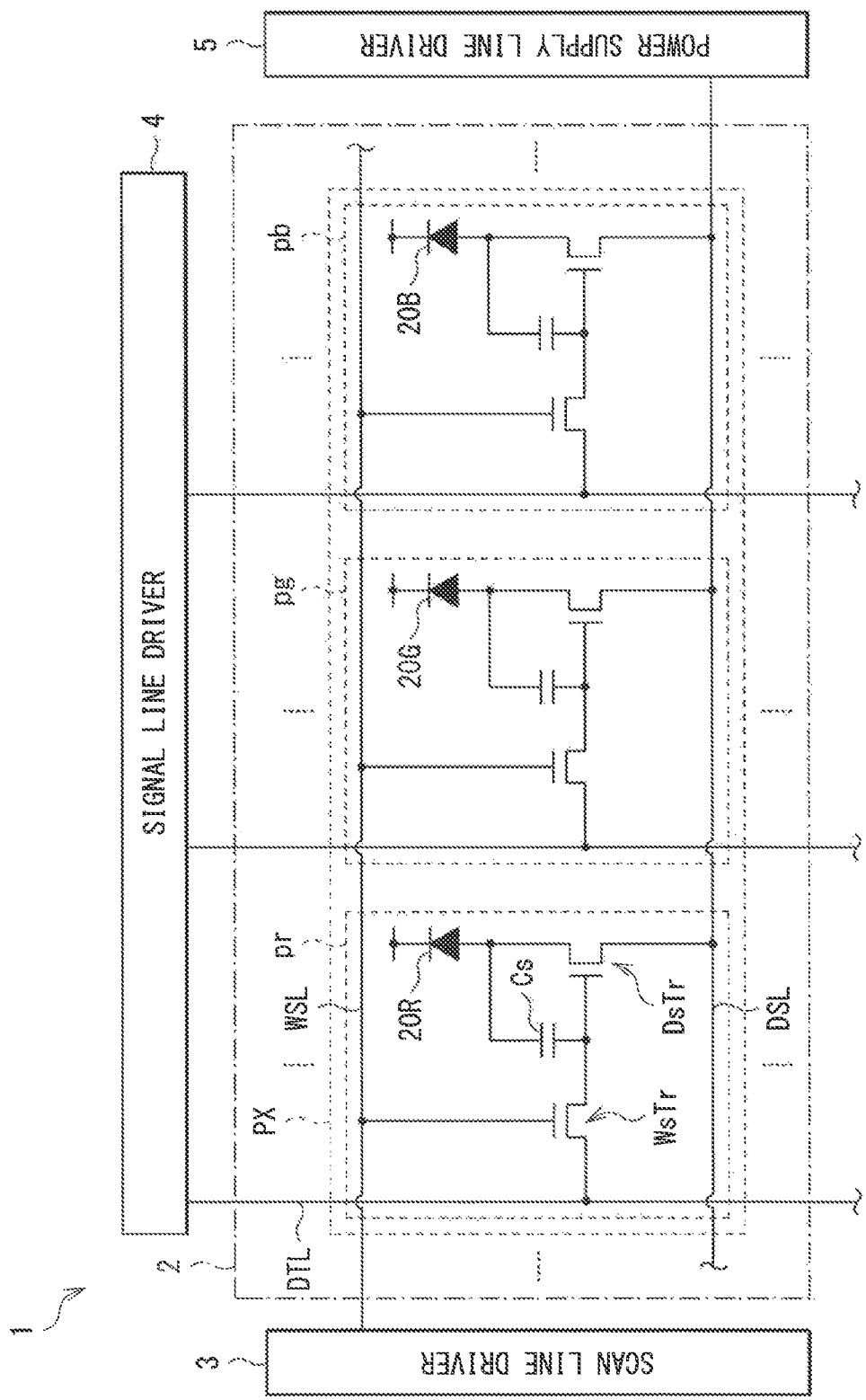
FIG. 1 is a block diagram that illustrates an overall configuration of a display device according to one embodiment of the disclosure.

Embodiment (examples of an active matrix substrate and a display device in which an upper electrode of a capacitor is electrically coupled to a low-resistance region of an oxide semiconductor layer of a TFT)
1. Configuration
2. Manufacturing Method
3. Workings and Effects Embodiment Configuration FIG. 1 is a block diagram that illustrates an overall configuration of a display device, or a display device 1, according to one embodiment of the disclosure. The display device 1 may be, without limitation, an organic electroluminescence (EL) display that provides color picture display by color mixture of, for example but not limited to, red (R), green (G), and blue (B).

The display device 1 may include a pixel unit 2 and circuitry. The pixel unit 2 may include a plurality of pixels in two-dimensional arrangement, e.g., pixels pr, pg, and pb. The circuitry may drive the pixel unit 2, and include a scan line driver 3, a signal line driver 4, and a power supply line driver 5, without limitation.

The pixel unit 2 may display an image on the basis of a picture signal inputted from outside, by an active matrix system, without limitation. The pixel unit 2 may include a plurality of scan lines WSL, a plurality of signal lines DTL, and a plurality of power supply lines DSL. The plurality of the scan lines WSL may extend in a row direction of a pixel array. The plurality of the signal lines DTL may extend in a column direction. The plurality of the power supply lines DSL may extend in the row direction. The scan lines WSL, the signal lines DTL, and the power supply lines DSL may be electrically coupled to each of the pixels pr, pg, and pb. The pixels pr, pg, and pb may each serve as a subpixel. A combination of the pixels pr, pg, and pb may constitute one pixel, i.e., a pixel PX.

The scan lines WSL may supply a selection pulse to each of the plurality of the pixels pr, pg, and pb arranged in the pixel unit 2. The selection pulse is provided for selection of the pixels pr, pg, and pb in units of rows. The scan lines WSL may each be coupled to an undepicted output end of the scan line driver 3 and to a gate electrode of a write transistor WsTr. The signal lines DTL may supply a signal pulse corresponding to the picture signal to each of the pixels pr, pg, and pb. The signal pulse may include a signal potential Vsig and a reference potential Vofs. The signal lines DTL may each be coupled to an undepicted output end of the signal line driver 4 and to a source electrode or a drain electrode of the write transistor WsTr. The power supply lines DSL may supply a fixed potential Vcc as electric power to each of the pixels pr, pg, and pb. The power supply lines DSL may each be coupled to an undepicted output end of the power supply line driver 5 and to a source electrode or a drain electrode of a drive transistor DsTr. It is to be noted that each of cathodes of organic EL elements 20R, 20G, and 20B may be coupled to, for example but not limited to, a common potential line, or a cathode line.

The scan line driver 3 may line-sequentially output the predetermined selection pulse to each of the scan lines WSL, and thereby allow each of the pixels pr, pg, and pb to execute, at predetermined timing, operations such as anode reset, Vth correction, writing of the signal potential Vsig, mobility correction, and light emission operation. The signal line driver 4 may generate an analog picture signal and output the resultant signal to each of the signal lines DTL. The analog picture signal may correspond to the digital picture signal inputted from the outside. The power supply line driver 5 may output a fixed potential to each of the power supply lines DSL. The scan line driver 3, the signal line driver 4, and the power supply line driver 5 may be controlled to operate in conjunction with one another, on the basis of a timing control signal outputted by an undepicted timing controller. The digital picture signal inputted from the outside may be subject to correction by an undepicted picture signal receiver, and thereafter, the resultant signal may be inputted to the signal line driver 4.

The pixel pr may include, for example but not limited to, the organic EL element 20R, a retention capacitor Cs, the write transistor WsTr, and the drive transistor DsTr. The organic EL element 20R may emit red color light. Likewise, the pixel pg may include, for example but not limited to, the organic EL element 20G, the retention capacitor Cs, the write transistor WsTr, and the drive transistor DsTr. The organic EL element 20G may emit green color light. The pixel pb may include, for example but not limited to, the organic EL element 20B, the retention capacitor Cs, the write transistor WsTr, and the drive transistor DsTr. The organic EL element 20B may emit blue color light.

The write transistor WsTr may control application of the picture signal, or the signal voltage, to a gate electrode of the drive transistor DsTr. In one specific but non-limiting example, the write transistor WsTr may sample a voltage of the signal line DTL, or the signal voltage, in response to a voltage applied to the scan line WSL, while writing the signal voltage to the gate electrode of the drive transistor DsTr. The drive transistor DsTr may be coupled in series to each of the organic EL elements 20R, 20G, and 20B. The drive transistor DsTr may control a current flowing through each of the organic EL elements 20R, 20G, and 20B in accordance with magnitude of the signal voltage sampled by the write transistor WsTr. The drive transistor DsTr and the write transistor WsTr may be constituted by, for example but not limited to, n-channel MOS or p-channel MOS thin film transistors (TFTs). The drive transistor DsTr and the write transistor WsTr may be of a single gate configuration, or alternatively, of a dual gate configuration. The retention capacitor Cs may retain a predetermined voltage between the gate electrode and the source electrode of the drive transistor DsTr.

The gate electrode of the write transistor WsTr may be coupled to the scan line WSL. One of the source electrode and the drain electrode of the write transistor WsTr may be coupled to the signal line DTL, and the other may be coupled to the gate electrode of the drive transistor DsTr. One of the source electrode and the drain electrode of the drive transistor DsTr may be coupled to the power supply line DSL, and the other may be coupled to the anode of the organic EL element 20R, 20G, or 20B. The retention capacitor Cs may be inserted between the gate electrode of the drive transistor DsTr and the electrode of the drive transistor DsTr on side on which the organic EL element 20R, 20G, or 20B is disposed.

It is to be noted that a 2Tr1C circuit configuration is given, here, as an example of a pixel circuit of the pixels pr, pg, and pb. However, the configuration of the pixel circuit of the pixels pr, pg, and pb is not limited thereto. The pixels pr, pg, and pb may have a circuit configuration in which capacitors, transistors, or other various components, or any combination thereof, are added to the 2Tr1C circuit as mentioned above.

Figure 2:
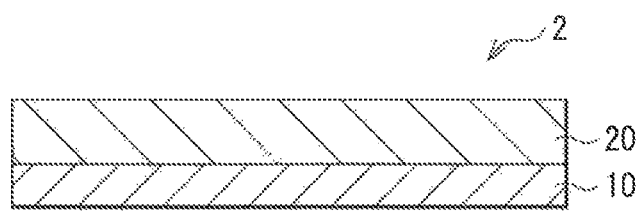
FIG. 2 is a cross-sectional view of a schematic configuration of the display device, or a pixel unit illustrated in FIG. 1.

FIG. 2 schematically illustrates a cross-sectional configuration of the display device 1, or the pixel unit 2. The pixel unit 2 may include, for example but not limited to, an active matrix substrate 10 as a backplane, and a display element layer 20. The display element layer 20 may include the organic EL elements 20R, 20G, and 20B as mentioned above. On the active matrix substrate 10, for example but not limited to, as mentioned above, the retention capacitors Cs, the write transistors WsTr, the drive transistors DsTr, the scan lines WSL, the signal lines DTL, and the power supply lines DSL may be provided. The retention capacitors Cs, the write transistors WsTr, the drive transistors DsTr, the scan lines WSL, the signal lines DTL, and the power supply lines DSL may constitute the pixel circuit of the pixels pr, pg, and pb.

Configuration of Main Part of Active Matrix Substrate 10

Figure 3:
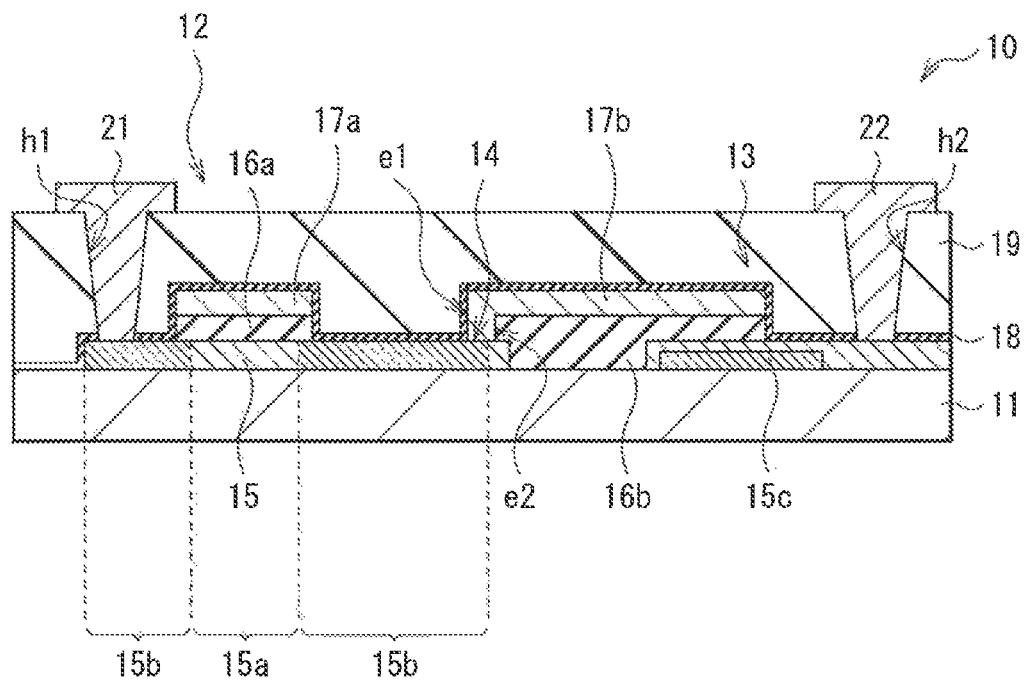
FIG. 3 is a cross-sectional view of a configuration of an active matrix substrate illustrated in FIG. 2.
Figure 4:
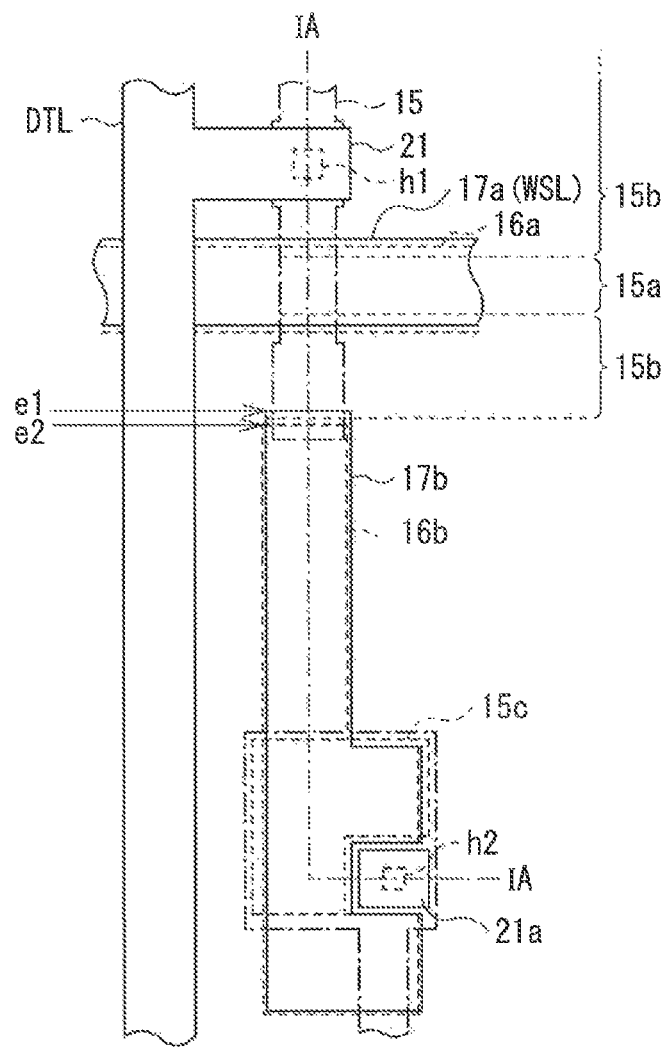
FIG. 4 is a plan view of a configuration of a main part of the active matrix substrate illustrated in FIG. 2.

FIG. 3 illustrates a cross-sectional configuration of the active matrix substrate 10. In FIG. 3, represented is a region including a TFT 12 and a retention capacitor 13. The TFT 12 may serve as the write transistor WsTr. The retention capacitor 13 may serve as the retention capacitor Cs. FIG. 4 illustrates a plan configuration of a main part of the active matrix substrate 10. It is to be noted that a configuration in cross-section taken along a line IA-IA in FIG. 4 corresponds to FIG. 3.

TFT 12 may be provided in, for example but not limited to, a selective region on the substrate 11. The TFT 12 may be, for example but not limited to, a thin film transistor of a top gate configuration, and include an oxide semiconductor layer 15 and a gate electrode 17a. The oxide semiconductor layer 15 may be provided on the substrate 11. The gate electrode 17a may be disposed on the oxide semiconductor layer 15 with an insulating film 16a in between. The gate electrode 17a may be disposed in confronted relation with a channel region 15a of the oxide semiconductor layer 15. The channel region 15a may serve as an active layer. The oxide semiconductor layer 15 may include a low-resistance region 15b. The low-resistance region 15b may be adjacent to the channel region 15a and have lower electrical resistance than the channel region 15a. To the low-resistance region 15b, a source-drain electrode 21 may be electrically coupled. The TFT 12 may have, for example but not limited to, a so-called self aligned element configuration in which the gate electrode 17a and the insulating film 16a may have a same shape in plan view. In other words, the gate electrode 17a and the insulating film 16a may be successively processed using a single photomask. The gate electrode 17a and the insulating film 16a may be provided in an island shape on, for example but not limited to, the oxide semiconductor layer 15. It is to be noted that in FIG. 3, illustrated is, for example but not limited to, a source-drain electrode 22 of the drive transistor DsTr as well. The source-drain electrode 22 may be electrically coupled to a lower electrode 15c of the retention capacitor 13.

The insulating film 16a corresponds to one specific example of a "first insulating film" in one embodiment of the disclosure. The channel region 15a corresponds to one specific example of a "first region" in one embodiment of the disclosure. The low-resistance region 15b corresponds to one specific example of a "second region" in one embodiment of the disclosure.

The retention capacitor 13 may be provided in a different region from the TFT 12 on the substrate 11. The retention capacitor 13 may include, on the substrate 11, the lower electrode 15c, an insulating film 16b, and an upper electrode 17b.

The insulating film 16b corresponds to one specific example of a "second insulating film" in one embodiment of the disclosure.

A high-resistance film 18 and an interlayer insulating film 19 may be provided on a part of the TFT 12 and on the retention capacitor 13. The high-resistance film 18 may be so provided as to cover an upper surface of the low-resistance region 15b of the oxide semiconductor layer 15 of the TFT 12, an upper surface of the gate electrode 17a, and an upper surface of the upper electrode 17b of the retention capacitor 13. The high-resistance film 18 and the interlayer insulating film 19 may have a contact hole h1 that is confronted with the low-resistance region 15b of the oxide semiconductor layer 15. The source-drain electrode 21 may be so provided as to fill the contact hole h1.

The substrate 11 may be made of, for example but not limited to, glass, quartz, silicon, a plastic material, or a metal plate. Non-limiting examples of the plastic material may include polyethylene terephthalate (PET), and polyethylene naphthalate (PEN). Because the oxide semiconductor layer 15 is deposited by, for example but not limited to, a sputtering method without heating the substrate 11, it is possible to utilize a low-cost plastic film as well.

The oxide semiconductor layer 15 may include, for example but not limited to, an oxide semiconductor, and have a thickness of, for example but not limited to, about 50 nm. Here, the term "oxide semiconductor" refers to a compound including, for example, one or more elements such as indium (In), gallium (Ga), zinc (Zn), and tin (Sn), and oxygen. Specific but non-limiting examples of an amorphous oxide semiconductor may include indium gallium zinc oxide (IGZO). Specific but non-limiting examples of a crystalline oxide semiconductor may include zinc oxide (ZnO), indium zinc oxide (IZO), indium gallium oxide (IGO), indium tin oxide (ITO), and indium oxide (InO).

The low-resistance region 15b may be adjacent to the channel region 15a, and be provided in at least a part on upper side in a thickness direction of the oxide semiconductor layer 15. The low-resistance region 15b may be, for example but not limited to, an n+ region. The low-resistance region 15b may have a lower oxygen concentration than that of the channel region 15a, or alternatively, the low-resistance region 15b may be lowered in resistance, with a metal element diffused as a dopant. Non-limiting examples of the metal element may include aluminum, titanium, and indium. The low-resistance region 15b may be formed with utilization of, for example but not limited to, the self aligned configuration and heat treatment using a metal film 18a described later. Forming the low-resistance region 15b makes it possible to stabilize characteristics of the TFT 12. It is to be noted that the low-resistance region 15b may be provided, here, in an entirety in the thickness direction of the oxide semiconductor layer 15. In one alternative, the low-resistance region 15b may be provided solely in a part on the upper side of the oxide semiconductor layer 15. In other words, the low-resistance region 15b may be provided solely in a part in which the oxide semiconductor layer 15 is in contact with the high-resistance film 18.

In one preferable but non-limiting example, the oxygen concentration of the low-resistance region 15b may be equal to or lower than 30%, without limitation. This is because the oxygen concentration of 30% or higher in the low-resistance region 15b may cause higher resistance. It is to be noted that in the oxide semiconductor layer 15, other regions than the channel region 15a and the low-resistance region 15b may have the oxygen concentration equivalent to that of the channel region 15a.

The lower electrode 15c may be level with, for example but not limited to, the oxide semiconductor layer 15. The lower electrode 15c may include, for example but not limited to, the same oxide semiconductor as the oxide semiconductor layer 15. However, in one alternative, the lower electrode 15c may be made of a conductive material different from the oxide semiconductor layer 15.

The insulating film 16a may be a gate insulating film provided between the channel region 15a of the oxide semiconductor layer 15 and the gate electrode 17a. The insulating film 16b may be provided between the lower electrode 15c and the upper electrode 17b. The insulating films 16a and 16b may be continuous with each other, or alternatively, the insulating films 16a and 16b may be separated from each other. However, the insulating films 16a and 16b may be spaced away from each other in a region confronted with the low-resistance region 15b of the oxide semiconductor layer 15. The insulating films 16a and 16b may be constituted by a single-layer film or a stacked film including, for example but not limited to, silicon oxide (SiO$_2$), silicon nitride (SiN), silicon oxide nitride (SiON), or aluminum oxide (Al$_2$O$_3$), or any combination thereof. In particular, silicon oxide or aluminum oxide may be preferable because they are unlikely to cause reduction of the oxide semiconductor layer 15. The insulating films 16a and 16b may be made of, for example but not limited to, the same material.

The gate electrode 17a may have a function of controlling electron density in the oxide semiconductor layer 15 by application of a gate voltage. The gate electrode 17a may be made of, for example but not limited to, a metal including molybdenum (Mo), aluminum (Al), copper (Cu), silver (Ag), or titanium (Ti), or any combination thereof.

The upper electrode 17b may be level with, for example but not limited to, the gate electrode 17a. The upper electrode 17b may be made of, for example but not limited to, the same material as the gate electrode 17a.

The upper electrode 17b corresponds to one specific example of an "electrode layer" in one embodiment of the disclosure.

The high-resistance film 18 may be an oxidized film of a metal film, i.e., the metal film 18a, utilized in forming the low-resistance region 15b in a manufacturing process described later. The high-resistance film 18 may include, for example but not limited to, a metal oxide such as aluminum oxide. However, the high-resistance film 18 may include, for example but not limited to, titanium oxide or indium oxide, in addition to or instead of aluminum oxide. The high-resistance film 18 may have optimal barrier properties against the air outside, and have a function of alleviating influences by oxygen or moisture that may change electrical characteristics of the oxide semiconductor layer 15. In one preferable but non-limiting example, a thickness of the high-resistance film 18 may be equal to or smaller than 20 nm, without limitation.

The interlayer insulating film 19 may be constituted by the single-layer film or the stacked film including, for example but not limited to, silicon oxide, silicon nitride, silicon oxide nitride, or aluminum oxide, or any combination thereof. The interlayer insulating film 19 in a form of the stacked film makes it possible to restrain moisture from intruding or diffusing into the oxide semiconductor layer 15, leading to enhancement in electrical stability and reliability of the TFT 12.

The source-drain electrode 21 may include, for example but not limited to, a metal including molybdenum (Mo), aluminum (Al), copper (Cu), silver (Ag), or titanium (Ti), or any combination thereof. In one preferable but non-limiting example, the source-drain electrode 21 may be so provided as to avoid overlap with a region directly above the gate electrode 17a. This makes it possible to reduce parasitic capacitance formed in a region where the gate electrode 17a crosses the source-drain electrode 21.

In the active matrix substrate 10, in the configuration as described above, for example, the oxide semiconductor layer 15, specifically the low-resistance region 15b, of the TFT 12 and the upper electrode 17b of the retention capacitor 13 may be electrically coupled to each other through a contact 14. In one specific but non-limiting example, the low-resistance region 15b of the oxide semiconductor layer 15 and the upper electrode 17b may be electrically coupled to each other at an end, i.e., an end e1, of the upper electrode 17b.

Configuration of Contact 14

Figure 5:
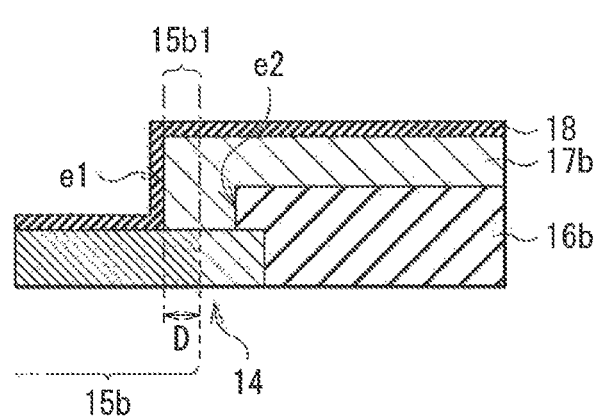
FIG. 5 is an enlarged cross-sectional view of a configuration of a contact illustrated in FIG. 3.

FIG. 5 illustrates, in an enlarged manner, a configuration in the vicinity of the contact 14. In the contact 14, an end e2 of the insulating film 16b may be provided at a more retreated position than the end e1 of the upper electrode 17b. The upper electrode 17b may be so provided as to overlap with the low-resistance region 15b of the oxide semiconductor layer 15. In other words, the low-resistance region 15b may include, at an opposite end to the channel region 15a, an overlap part 15b1 on which the end e1 of the upper electrode 17b may be superposed. In this example, the upper electrode 17b and the low-resistance region 15b may be so provided as to be in direct contact with each other.

In one preferable but non-limiting example, a width D of the overlap part 15b1 may be set in a range of, for example but not limited to, 0.5 μm to 2 μm both inclusive. The width D of 0.5 μm or more allows for a stable current flow. On the other hand, because the width D substantially coincides with a width of shrinkage of an effective channel length of the TFT 12, an excessive increase in the width D may cause an excessively large design channel length for functioning as a TFT. This contributes to a lower degree of freedom of layout. Accordingly, in one preferable but non-limiting example, an upper limit of the width D may be about 2 μm. The width D may be controlled by adjusting, as appropriate, for example but not limited to, a material of the metal film 18a, anneal conditions, and process conditions, e.g., a shape of the end of the insulating film 16b in the manufacturing process described later. The width D of the overlap part 15b1 may be calculated by evaluation of the effective channel length of the TFT by, for example but not limited to, a transfer length method (TLM). In one alternative, the width D may be analyzed by measurement of the oxygen concentration in the film of the oxide semiconductor layer 15 using energy dispersive X-ray spectroscopy (EDX).

Manufacturing Method

The active matrix substrate 10 as described above may be manufactured, for example, as follows. FIGS. 6 to 13 illustrate a manufacturing process of the active matrix substrate 10 in the order of the procedure.

Figure 6:
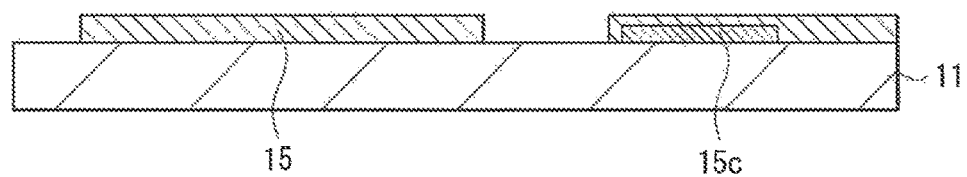
FIG. 6 is a cross-sectional view provided for description of a method of manufacturing the active matrix substrate illustrated in FIG. 3.

First, as illustrated in FIG. 6, the oxide semiconductor layer 15 and the lower electrode 15c may be formed in the selective region of the substrate 11, i.e., in a region where the TFT 12 is to be formed and in a region where the retention capacitor 13 is to be formed. In forming the oxide semiconductor layer 15, for example, first, on an entire surface of the substrate 11, an oxide semiconductor film may be formed by, for example but not limited to, the sputtering method. The oxide semiconductor film may be made of the oxide semiconductor as mentioned above. At this occasion, as a target, a ceramic target may be used that has a same composition as that of the oxide semiconductor film to be formed. A carrier density in the oxide semiconductor film depends largely on a partial pressure of oxygen in the sputtering. Accordingly, the partial pressure of oxygen may be so controlled as to obtain desired transistor characteristics. The oxide semiconductor film thus deposited may be processed by, for example but not limited to, photolithography and etching, to collectively form the oxide semiconductor layer 15 and the lower electrode 15c. In one preferable but non-limiting example, in the etching, the processing may be carried out by wet etching with use of liquid mixture of a phosphoric acid, a nitric acid, and an acetic acid. The liquid mixture of the phosphoric acid, the nitric acid, and the acetic acid makes it possible to provide a sufficiently large selective ratio with respect to the substrate 11 as a base, allowing for relatively easy processing.

Figure 7A:
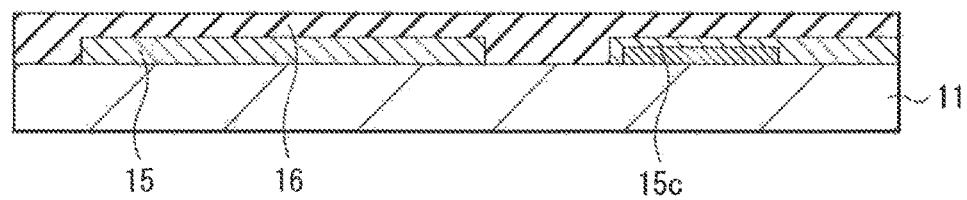
FIG. 7A is a cross-sectional view of a process following FIG. 6.

Thereafter, the insulating films 16a and 16b may be formed. Specifically, first, as illustrated in FIG. 7A, an insulating film 16 may be deposited on the entire surface of the substrate 11, so as to cover the oxide semiconductor layer 15, by a plasma chemical vapor deposition (CVD) method or a reactive sputtering method, without limitation. The insulating film 16 may include, for example but not limited to, materials as mentioned above, e.g., silicon oxide. It is to be noted that in a case with an aluminum oxide film formed as the insulating film 16, the aluminum oxide film may be formed by, for example but not limited to, the reactive sputtering method, a CVD method, or an atomic layer deposition method.

Figure 7B:
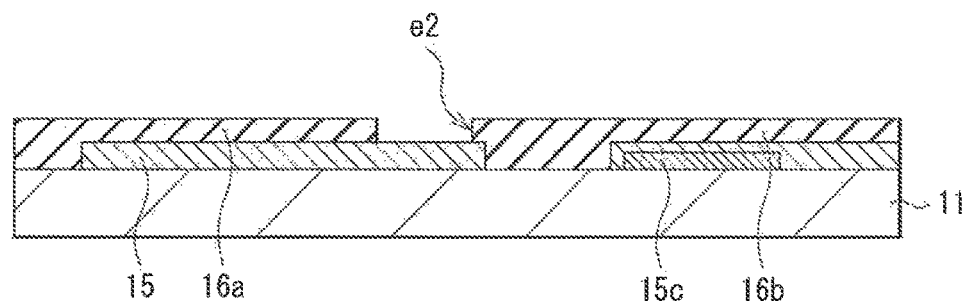
FIG. 7B is a cross-sectional view of a process following FIG. 7A.

Thereafter, as illustrated in FIG. 7B, the insulating film 16 may be processed by, for example but not limited to, the photolithography and the etching. Thus, the insulating film 16b may be formed. At this occasion, the processing may be carried out to allow a part of the oxide semiconductor layer 15 to be exposed from the insulating film 16b. For example, the processing may be carried out to allow the end of the oxide semiconductor layer 15 on side on which the lower electrode 15c is disposed to be exposed from the insulating film 16b. It is to be noted that in patterning of the end e2 of the insulating film 16b, the insulating film 16a may be processed into a desired shape. However, as described later, the insulating film 16a may be processed into the desired shape together with the gate electrode 17a, in processing the gate electrode 17a.

Figure 8:
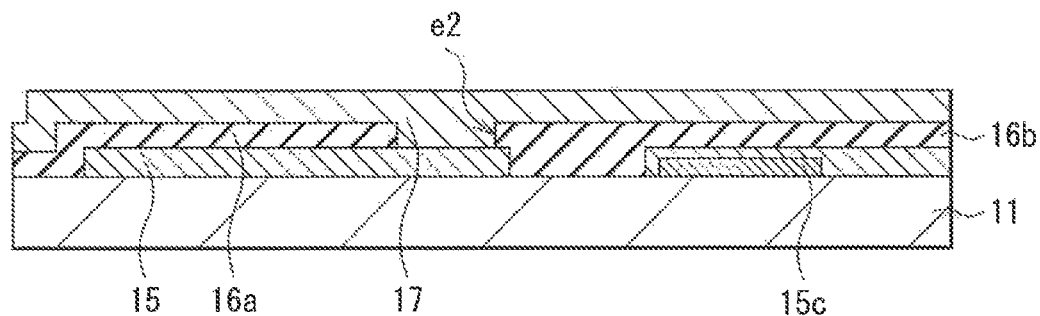
FIG. 8 is a cross-sectional view of a process following FIG. 7B.

Thereafter, the gate electrode 17a and the upper electrode 17b may be formed. For example, as illustrated in FIG. 8, the gate electrode layer 17 may be deposited on the entire surface of the substrate 11 by, for example but not limited to, the sputtering method. The gate electrode layer 17 may include the materials as mentioned above.

Figure 9:
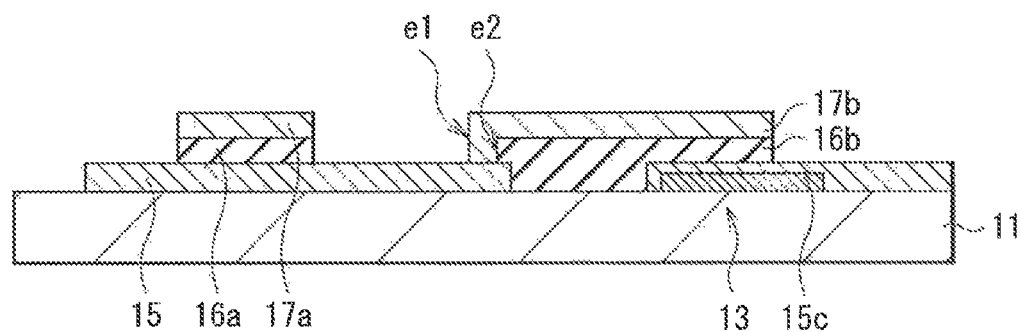
FIG. 9 is a cross-sectional view of a process following FIG. 8.

Thereafter, as illustrated in FIG. 9, the gate electrode layer 17 may be processed by, for example but not limited to, the photolithography and the etching. Thus, the gate electrode 17a and the upper electrode 17b may be processed into desired shapes. Thereafter, the insulating film 16a may be etched with the gate electrode 17a serving as a mask. Thus, the insulating film 16a may be patterned into the desired shape. In a case with use of the crystalline materials such as ZnO, IZO, and IGO as the oxide semiconductor layer 15, the insulating film 16a may be etched using a chemical liquid such as a hydrofluoric acid. Accordingly, it is possible to provide a large etching ratio between the insulating film 16a and the oxide semiconductor layer 15, leading to easy processing. As described, the gate electrode 17a and the insulating film 16a may be successively patterned using the single photomask. This makes it possible to form the insulating film 16a and the gate electrode 17a in the same shape in this order on the oxide semiconductor layer 15. Moreover, other regions than the end e2 of the insulating film 16b may be formed in a substantially same shape as that of the upper electrode 17b.

In the meanwhile, the upper electrode 17b may be patterned, for example, with the end e1 of the upper electrode 17b superposed on a part of the oxide semiconductor layer 15. At this occasion, the upper electrode 17b may be processed, with the end e1 extending beyond the end e2 of the insulating film 16*b*. In other words, the upper electrode 17*b* may be processed, with the end e2 formed at the more retreated position than the end e1. Moreover, as mentioned above, the width D of the overlap part 15*b*1 of the low-resistance region 15*b* may be controlled by the adjustment of an edge shape or a shape of a side surface of the end e1 by the process conditions. It is to be noted that in the figures such as FIG. 9, the edge, or the side surface, of the end e1 of the upper electrode 17*b* is a perpendicular surface to the substrate surface. However, in one alternative, the edge, or the side surface, of the end e1 of the upper electrode 17*b* may be an inclined surface.

Figure 10:
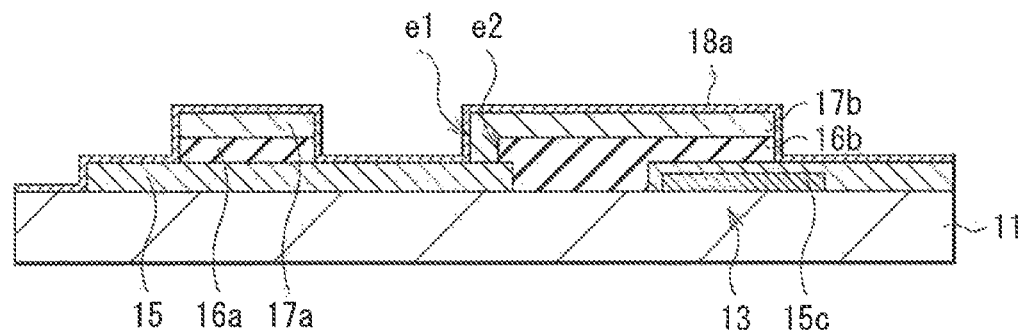
FIG. 10 is a cross-sectional view of a process following FIG. 9.

Thereafter, the low-resistance region 15*b* may be formed in a predetermined region of the oxide semiconductor layer 15. Specifically, first, as illustrated in FIG. 10, the metal film 18*a* may be formed with a predetermined thickness, by, for example but not limited to, the sputtering method. The metal film 18*a* may be made of a metal that reacts with oxygen at a relatively low temperature, e.g., aluminum (Al), titanium (Ti), or indium (In). The metal film 18*a* may be so formed as to cover a stack of the oxide semiconductor layer 15, the insulating film 16*a*, and the gate electrode 17*a*, and as to cover the upper electrode 17*b*.

Figure 11:
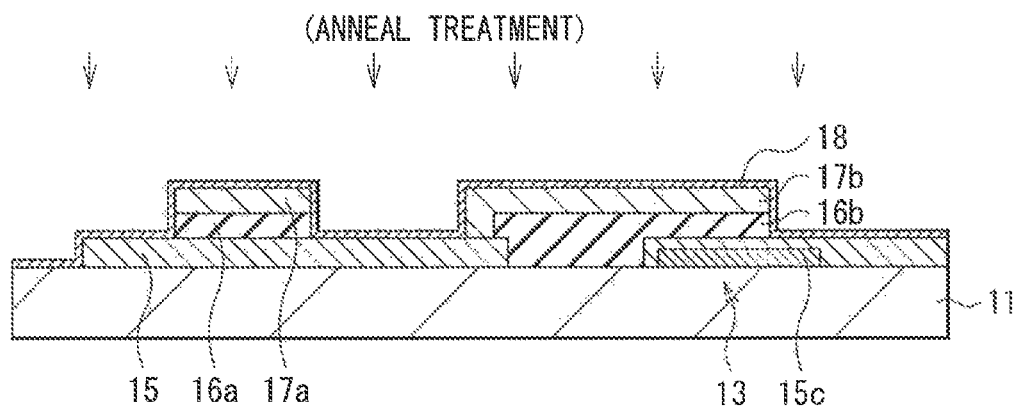
FIG. 11 is a cross-sectional view of a process following FIG. 10.
Figure 12:
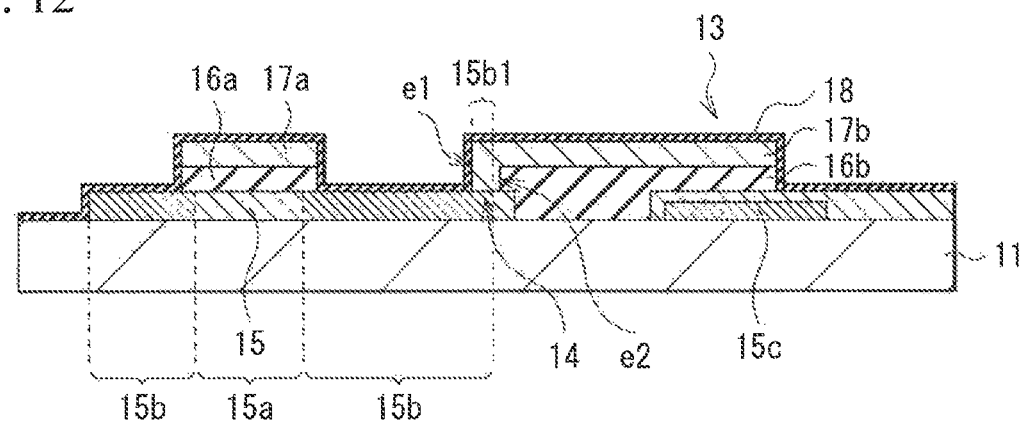
FIG. 12 is a cross-sectional view of a process following FIG. 11.

Thereafter, as illustrated in FIG. 11, anneal treatment, or heat treatment, may be carried out. This causes oxidization of the metal film 18*a*. In the oxidizing reaction of the metal film 18*a*, utilized is part of the oxygen included in the oxide semiconductor layer 15. Accordingly, as the oxidization of the metal film 18*a* progresses, the oxygen may be released from the upper side of the oxide semiconductor layer 15 on which the oxide semiconductor layer 15 is in contact with the metal film 18*a*. This causes a decrease in the oxygen concentration in the film. Moreover, the metal element included in the metal film 18*a* may be diffused as the dopant into the oxide semiconductor layer 15. Therefore, as illustrated in FIG. 12, the low-resistance region 15*b* may be formed, corresponding to the part of the oxide semiconductor layer 15 where the oxide semiconductor layer 15 is in contact with the metal film 18*a*. The low-resistance region 15*b* may have the lower oxygen concentration than the channel region 15*a*, or alternatively, the low-resistance region 15*b* may include the metal element as the dopant. In the meanwhile, the metal film 18*a* may be oxidized to become the high-resistance film 18.

At this occasion, the low-resistance region 15*b* may be so formed as to gradually spread along a depthwise direction from the part of the oxide semiconductor layer 15 where the oxide semiconductor layer 15 is in contact with the metal film 18*a*. The depthwise direction refers to a direction perpendicular to the substrate surface. The spread of the low-resistance region 15*b* may also occur along a lateral direction. The lateral direction refers to a direction parallel to the substrate surface. Thus, the overlap part 15*b*1 may be formed at the end of the low-resistance region 15*b*. In the overlap part 15*b*1, the low-resistance region 15*b* may overlap with the upper electrode 17*b*. By the overlap part 15*b*1, the electrical coupling of the low-resistance region 15*b* of the oxide semiconductor layer 15 to the upper electrode 17*b* may be made. In other words, the contact 14 may be formed.

In one preferable but non-limiting example, the anneal treatment to oxidize the metal film 18*a* may be carried out at a temperature of, for example but not limited to, about 300° C. in an oxidizing gas atmosphere including oxygen, without limitation. This makes it possible to restrain the oxygen concentration of the low-resistance region 15*b* from becoming excessively low, and to supply a sufficient amount of oxygen to the oxide semiconductor layer 15. Accordingly, it is possible to eliminate an anneal process to be carried out in a post-process, leading to simplification of the process.

Moreover, for example, in the process of forming the metal film 18*a* as illustrated in FIG. 10, the temperature of the substrate 11 may be a relatively high temperature, e.g., about 200° C. This makes it possible to form the low-resistance region 15*b* without carrying out the anneal treatment as illustrated in FIG. 11. In this case, it is possible to reduce the carrier density of the oxide semiconductor layer 15 to a necessary level for a transistor.

In one preferable but non-limiting example, a thickness of the metal film 18*a* may be equal to or smaller than, for example but not limited to, 10 nm. With the thickness of the metal film 18*a* being 10 nm or less, it is possible to sufficiently oxidize the metal film 18*a* by the anneal treatment. Insufficient oxidization of the metal film 18*a* may cause occurrence of leak currents. Accordingly, in one preferable but non-limiting example, the metal film 18*a* may be removed by the etching after the anneal treatment. In a case in which the metal film 18*a* is sufficiently oxidized to become the high-resistance film 18, the removal is unnecessary, leading to the simplification of the manufacturing process. With the metal film 18*a* being formed with the thickness of 10 nm or less, the thickness of the high-resistance film 18 may be equal to or smaller than 20 nm, without limitation.

It is to be noted that non-limiting examples of the method of oxidizing the metal film 18*a* to form the low-resistance region 15*b* may include not only the anneal treatment in the oxygen atmosphere as mentioned above but also oxidization in a water vapor atmosphere and plasma oxidization. For example, in a case where the interlayer insulating film 19 is formed by the plasma CVD method in the post-process, the metal film 18*a* may be oxidized, or plasma oxidized, immediately before the post-process. In this case, it is possible to oxidize the metal film 18*a* without particularly increasing the number of processes. In the plasma oxidization, in one preferable but non-limiting example, with the temperature of the substrate 11 being about 200° C. to 400° C. both inclusive, plasma may be generated in an oxygen-including gas atmosphere such as oxygen and oxygen dinitride, to carry out the treatment. This makes it possible to form the high-resistance film 18 having the optimal barrier properties against the air outside as mentioned above. In addition to the techniques as mentioned above, in one alternative, the reactive sputtering may be performed, with a metal serving as a target, while introducing oxygen. This makes it possible to reduce possibility of the occurrence of the leak currents due to the insufficient oxidization. Moreover, it is possible to increase a film thickness to enhance the barrier properties.

Figure 13:
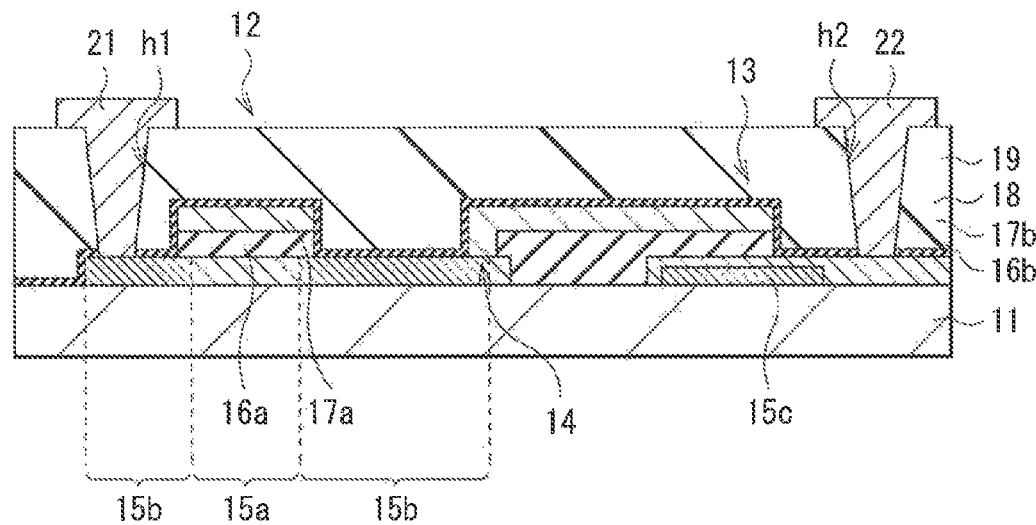
FIG. 13 is a cross-sectional view of a process following FIG. 12.

Thereafter, as illustrated in FIG. 13, the interlayer insulating film 19 may be formed on the high-resistance film 18. The interlayer insulating film 19 may include the material as mentioned above. At this occasion, in depositing a silicon oxide film, the plasma CVD method may be utilized, without limitation. In depositing an aluminum oxide film, in one preferable but non-limiting example, the reactive sputtering method with aluminum serving as a target and with a DC or AC power supply may be utilized, without limitation. This allows for high speed deposition.

Thereafter, the source-drain electrode 21 may be formed. Specifically, first, the interlayer insulating film 19 and the high-resistance film 18 may be provided with the contact hole h1 using, for example but not limited to, the photolithography and the etching. Thereafter, on the interlayer insulating film 19, the metal material as mentioned above may be deposited by, for example but not limited to, the sputtering method, so as to fill the contact hole h1. Thereafter, the metal material thus deposited may be patterned into the predetermined shape by, for example but not limited to, the photolithography and the etching. It is to be noted that at this occasion, the source-drain electrode 22 may be also formed, as with the source-drain electrode 21, so as to fill a contact hole h2 provided in the interlayer insulating film 19 and the high-resistance film 18. Thus, the source-drain electrode 21 may be formed, and the TFT 12 may be formed. As described above, the active matrix substrate 10 as illustrated in FIG. 1 may be completed.

Workings and Effects

In the display device 1 according to this embodiment, the selective pulse may be supplied from the scan line driver 3 illustrated in FIG. 1 to the write transistor WsTr of each of the pixels pr, pg, and pb. Thus, the pixel pr, pg, or pb may be selected. To the pixel pr, pg, or pb thus selected, the signal voltage corresponding to the picture signal may be supplied from the signal line driver 4. The signal voltage may be retained by the retention capacitor Cs. The drive transistor DsTr may be on-off controlled in accordance with the signal retained by the retention capacitor Cs, causing injection of a drive current into the organic EL element 20R, 20G, or 20B. Thus, the organic EL element 20R, 20G, or 20B may emit light, and color light may be extracted from each of the pixels pr, pg, and pb. By additive color mixture of the color light, color picture display may be provided.

The display device 1 includes the active matrix substrate 10 as the backplane. On the active matrix substrate 10, not only various wirings such as the scan lines WSL, the signal lines DTL, and the power supply lines DSL but also the TFT 12 and the retention capacitor 13 may be provided, as mentioned above. The TFT 12 may serve as the write transistor WsTr. The retention capacitor 13 may serve as the retention capacitor Cs. The oxide semiconductor layer 15, specifically the low-resistance region 15b, of the TFT 12 and the upper electrode 17b of the retention capacitor 13 may be electrically coupled to each other through the contact 14, so as to constitute the pixel circuit.

Figure 14:
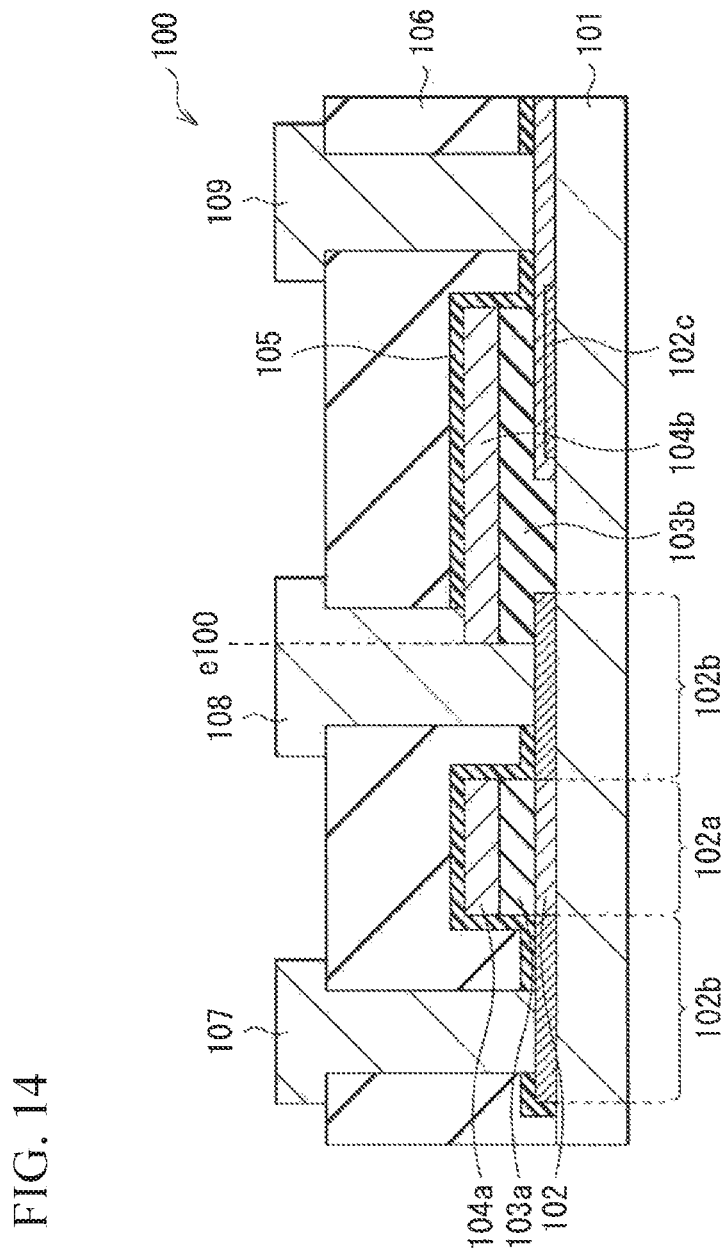
FIG. 14 is a cross-sectional view of a configuration of an active matrix substrate according to a comparative example.

Here, FIG. 14 illustrates a configuration of an active matrix substrate 100 according to a comparative example of this embodiment. In the active matrix substrate 100, an oxide semiconductor layer 102 may be provided in a selective region on a substrate 101. The oxide semiconductor layer 102 may constitute a TFT. On the oxide semiconductor layer 102, a gate electrode 104a may be provided with a gate insulating film, or an insulating film 103a, in between. The gate electrode 104a may be disposed in confronted relation to a channel region 102a of the oxide semiconductor layer 102. The channel region 102a may serve as an active layer. The oxide semiconductor layer 102 may include a low-resistance region 102b. The low-resistance region 102b may be adjacent to the channel region 102a. To the low-resistance region 102b, source-drain electrodes 107 and 108 may be electrically coupled. Moreover, a high-resistance film 105 may be so formed as to cover an upper surface of the low-resistance region 102b of the oxide semiconductor layer 102, and as to cover an upper surface of the gate electrode 104a. On the high-resistance film 105, an interlayer insulating film 106 may be formed. In a different region from the TFT, a lower electrode 102c, an insulating film 103b, and an upper electrode 104b may be provided. The lower electrode 102c, the insulating film 103b, and the upper electrode 104b may constitute a retention capacitor. The upper electrode 104b may be level with the gate electrode 104a. The lower electrode 102c may be electrically coupled to the source-drain electrode 109.

In the active matrix substrate 100, the high-resistance film 105 and the interlayer insulating film 106 may be provided with a contact hole H100. The source-drain electrode 108 may be so provided as to fill the contact hole H100. The upper electrode 104b and the insulating film 103b may have the same shape, or the same pattern, in plan view. Ends, i.e., ends e100, of the upper electrode 104b and the insulating film 103b may be in registry with each other. With this configuration, the oxide semiconductor layer 102, specifically the low-resistance region 102b, of the TFT and the upper electrode 104b of the retention capacitor may be electrically coupled to each other through the source-drain electrode 108. In this comparative example, interposition of the source-drain electrode 108 causes an increase in size of a contact between the oxide semiconductor layer 102 and the upper electrode 104b. This results in a lowered degree of freedom in design layout.

In contrast, in the contact 14 according to this embodiment, the upper electrode 17b may be electrically coupled, at the end e1, to the low-resistance region 15b of the oxide semiconductor layer 15. Moreover, in this embodiment, the end e2 of the insulating film 16b may be provided at the more retreated position from the end e1 of the upper electrode 17b. Accordingly, it is possible to make the electrical coupling of the oxide semiconductor layer 15, specifically the low-resistance region 15b, of the TFT 12 to the upper electrode 17b, without the interposition of the source-drain electrode 108 as in the forgoing comparative example. This results in a smaller contact size and a higher degree of freedom of the design layout.

As described, in this embodiment, the electrode layer, e.g., the upper electrode 17b of the retention capacitor 13, may be level with the gate electrode 17a, and be provided in the different region from the TFT 12. The electrode layer, e.g., the upper electrode 17b, may be electrically coupled, at the end e1, to the low-resistance region 15b of the oxide semiconductor layer 15 of the TFT 12. This makes it possible to make the electrical coupling of the oxide semiconductor layer 15 of the TFT 12 to the upper electrode 17b without interposition of other metal layers, leading to the higher degree of freedom in the design layout. Hence, it is possible to enhance definition and yield.

Although description of the disclosure has been made by giving the example embodiments as mentioned above, the contents of the disclosure are not limited to the abovementioned example embodiments and may be modified in a variety of ways. For example, in the above-described example embodiments, description is made with the upper electrode 17b of the retention capacitor given as an example of the "electrode layer" of one embodiment of the disclosure. However, the "electrode layer" of one embodiment of the disclosure is not limited thereto. The "electrode layer" of one embodiment of the disclosure may be applicable to an electrode or a wiring of other various elements in which the electrode or the wiring is level with the gate electrode.

Moreover, in the above-described example embodiments, description is given on the case of the TFT of the self aligned configuration. However, the configuration of the thin film transistor according to one embodiment of the disclosure is not limited to the self aligned configuration, as long as the gate electrode is disposed in the confronted relation to the channel region, i.e., the first region, of the oxide semiconductor layer with the insulating film in between, and the oxide semiconductor layer includes the second region having the lower resistance than the first region.

In addition, for example, a material and a thickness, or deposition methods or deposition conditions of each layer as described in the above-mentioned example embodiments are not limitative, but other materials and other thicknesses, or other deposition methods and other deposition conditions may be adopted.

Furthermore, the configuration of the pixel circuit for active-matrix driving is not limited to as exemplified in the above-described example embodiments. A capacitor or a transistor may be added as necessary. In this case, according to changes or alterations of the pixel circuit, an additional drive circuit may be provided, as necessary, in addition to or instead of the scan line driver 3, the signal line driver 4, and the power supply line driver 5.

It is to be noted that effects described in the specification are merely exemplified and not limited thereto, and effects of the disclosure may be other effects or may further include other effects.

It is possible to achieve at least the following configurations from the above-described example embodiments of the disclosure.

(1)

An active matrix substrate, including:

a substrate;

a thin film transistor that is provided on the substrate and includes an oxide semiconductor layer, a gate electrode, and source and drain electrodes, the oxide semiconductor layer including a first region as a channel region, the gate electrode being disposed in confronted relation with the first region of the oxide semiconductor layer with a first insulating film in between, and the source and drain electrodes being electrically coupled to the oxide semiconductor layer;

an electrode layer that is level with the gate electrode, is provided in a different region from the thin film transistor, and includes a first end; and a second insulating film that is provided between the substrate and the electrode layer and includes a second end at a more retreated position than the first end of the electrode layer, the oxide semiconductor layer further including a second region having lower resistance than the first region, and the electrode layer being electrically coupled, at the first end, to the second region of the oxide semiconductor layer.

(2)

The active matrix substrate according to (1), in which the electrode layer is provided in overlapping relation with the oxide semiconductor layer.

(3)

The active matrix substrate according to (2), in which the oxide semiconductor layer includes the second region in adjacent relation to the first region, and the second region includes, at an opposite end to the first region, an overlap part in which the second region overlaps with the electrode layer.

(4)

The active matrix substrate according to any one of (1) to (3), further including a high-resistance film that includes a metal oxide and covers respective upper surfaces of the gate electrode, the electrode layer, and the second region of the oxide semiconductor layer.

(5)

The active matrix substrate according to any one of (1) to (4), in which in the thin film transistor, the gate electrode and the first insulating film have a same shape in plan view.

(6)

The active matrix substrate according to any one of (1) to (5), further including a capacitor, the capacitor including:

a first electrode layer that is level with the oxide semiconductor layer of the thin film transistor; and a second electrode layer that is provided on the first electrode layer with the second insulating film in between and serves as the electrode layer.

(7)

The active matrix substrate according to (6), in which the first electrode layer includes a same oxide semiconductor as the oxide semiconductor layer, and the second electrode layer includes a same material as the gate electrode.

(8)

A method of manufacturing an active matrix substrate, the method including:

forming a thin film transistor on a substrate, the thin film transistor including an oxide semiconductor layer, a gate electrode, and source and drain electrodes, the oxide semiconductor layer including a first region as a channel region, the gate electrode being disposed in confronted relation with the first region of the oxide semiconductor layer with a first insulating film in between, and the source and drain electrodes being electrically coupled to the oxide semiconductor layer;

forming, in a different region from the thin film transistor, an electrode layer that is level with the gate electrode and includes a first end; and forming a second insulating film between the substrate and the electrode layer, the second insulating film including a second end at a more retreated position than the first end of the electrode layer, the oxide semiconductor layer further including a second region having lower resistance than the first region, and the electrode layer being electrically coupled, at the first end, to the second region of the oxide semiconductor layer.

(9)

The method of manufacturing the active matrix substrate according to (8), in which the electrode layer is formed in overlapping relation with the oxide semiconductor layer.

(10)

The method of manufacturing the active matrix substrate according to (9), in which after the electrode layer and the gate electrode are formed, a metal film is formed and heat treatment is performed, to form the second region.

(11)

The method of manufacturing the active matrix substrate according to any one of (8) to (10), in which in the forming of the thin film transistor, the gate electrode and the first insulating film are successively processed in a same process.

(12)

A display device provided with an active matrix substrate, the active matrix substrate including:

a substrate;

a thin film transistor that is provided on the substrate and includes an oxide semiconductor layer, a gate electrode, and source and drain electrodes, the oxide semiconductor layer including a first region as a channel region, the gate electrode being disposed in confronted relation with the first region of the oxide semiconductor layer with a first insulating film in between, and the source and drain electrodes being electrically coupled to the oxide semiconductor layer;

an electrode layer that is level with the gate electrode, is provided in a different region from the thin film transistor, and includes a first end; and a second insulating film that is provided between the substrate and the electrode layer and includes a second end at a more retreated position than the first end of the electrode layer, the oxide semiconductor layer further including a second region having lower resistance than the first region, and the electrode layer being electrically coupled, at the first end, to the second region of the oxide semiconductor layer.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "about" as used herein can allow for a degree of variability in a value or range. Moreover, no element or component in this disclosure is intended to be dedicated to the public regardless of whether the element or component is explicitly recited in the following claims.

What is claimed is:

1. An active matrix substrate, comprising:
   a substrate;
   a thin film transistor that is provided on the substrate and includes an oxide semiconductor layer, a gate electrode, and source and drain electrodes, the oxide semiconductor layer including a first region as a channel region, the gate electrode being disposed in confronted relation with the first region of the oxide semiconductor layer with a first insulating film in between, and the source and drain electrodes being electrically coupled to the oxide semiconductor layer;
   an electrode layer in a different region from the thin film transistor, and includes a first end adjacent to the thin film transistor; and
   a second insulating film that is provided between the substrate and the electrode layer and includes a second end adjacent to the thin film transistor, wherein the second end is farther from the thin film transistor than the first end of the electrode layer,
   the oxide semiconductor layer further including a second region having lower resistance than the first region, and
   the electrode layer being electrically coupled, at the first end, to the second region of the oxide semiconductor layer, wherein
   the electrode layer directly contacts both a top surface of the second insulating film and a side surface of the second insulating film.

2. An active matrix substrate, comprising:
   a substrate;
   a thin film transistor that is provided on the substrate and includes an oxide semiconductor layer, a gate electrode, and source and drain electrodes, the oxide semiconductor layer including a first region as a channel region, the gate electrode being disposed in confronted relation with the first region of the oxide semiconductor layer with a first insulating film in between, and the source and drain electrodes being electrically coupled to the oxide semiconductor layer;
   an electrode layer in a different region from the thin film transistor, and includes a first end adjacent to the thin film transistor; and
   a second insulating film that is provided between the substrate and the electrode layer and includes a second end adjacent to the thin film transistor, wherein the second end is farther from the thin film transistor than the first end of the electrode layer,
   the oxide semiconductor layer further including a second region having lower resistance than the first region, and
   the electrode layer being electrically coupled, at the first end, to the second region of the oxide semiconductor layer, wherein
   a bottom-most surface of the electrode layer is closer to the substrate than a top-most surface of the second insulating film.

3. An active matrix substrate, comprising:
   a substrate;
   a thin film transistor that is provided on the substrate and includes an oxide semiconductor layer, a gate electrode, and source and drain electrodes, the oxide semiconductor layer including a first region as a channel region, the gate electrode being disposed in confronted relation with the first region of the oxide semiconductor layer with a first insulating film in between, and the source and drain electrodes being electrically coupled to the oxide semiconductor layer;
   an electrode layer in a different region from the thin film transistor, and includes a first end adjacent to the thin film transistor; and
   a second insulating film that is provided between the substrate and the electrode layer and includes a second end adjacent to the thin film transistor, wherein the second end is farther from the thin film transistor than the first end of the electrode layer,
   the oxide semiconductor layer further including a second region having lower resistance than the first region, and
   the electrode layer being electrically coupled, at the first end, to the second region of the oxide semiconductor layer, wherein
   the electrode layer directly contacts the second region.

* * * * *